(12) United States Patent
Tseng et al.

(10) Patent No.: US 8,113,412 B1
(45) Date of Patent: Feb. 14, 2012

(54) METHODS FOR DETECTING DEFECT CONNECTIONS BETWEEN METAL BUMPS

(75) Inventors: Nan-Hsin Tseng, Tainan (TW); Yun-Han Lee, Baoshan Township (TW); Chin-Chou Liu, Jhubei (TW); Ji-Jan Chen, Hsin-Chu (TW); Wei-Pin Changchien, Taichung (TW); Chien-Hui Chen, Jhu-Dong Township (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 0 days.

(21) Appl. No.: 13/107,476

(22) Filed: May 13, 2011

(51) Int. Cl.
*B23K 31/02* (2006.01)
*B23K 31/12* (2006.01)

(52) U.S. Cl. .... 228/103; 228/104; 228/105; 228/180.22

(58) Field of Classification Search .................. None
See application file for complete search history.

(56) References Cited

U.S. PATENT DOCUMENTS

| | | | |
|---|---|---|---|
| 5,012,502 A * | 4/1991 | Battin et al. .................. 378/58 |
| 6,251,586 B1 | 6/2001 | Mulshine et al. |
| 6,365,423 B1 | 4/2002 | Heinlein et al. |
| 6,589,860 B1 * | 7/2003 | Ang et al. ..................... 438/613 |
| 6,649,832 B1 * | 11/2003 | Brophy et al. ................ 174/535 |
| 6,815,345 B2 | 11/2004 | Zhao et al. |
| 7,319,341 B1 * | 1/2008 | Harms et al. ............. 324/754.28 |
| 2002/0053589 A1 * | 5/2002 | Owen et al. ................... 228/104 |
| 2005/0032272 A1 * | 2/2005 | Prather et al. ................. 438/108 |
| 2006/0022668 A1 * | 2/2006 | Yamamoto .................... 324/210 |
| 2006/0023109 A1 * | 2/2006 | Mabuchi et al. .............. 348/340 |
| 2006/0055037 A1 * | 3/2006 | Park et al. ..................... 257/737 |
| 2007/0033553 A1 * | 2/2007 | Katagiri et al. ................... 716/4 |
| 2007/0037377 A1 * | 2/2007 | Richardson et al. .......... 438/613 |
| 2007/0069646 A1 * | 3/2007 | Hasegawa et al. ............. 313/555 |
| 2007/0196934 A1 | 8/2007 | Hiang et al. |
| 2007/0196935 A1 | 8/2007 | Hiang et al. |
| 2008/0297138 A1 * | 12/2008 | Taylor et al. .............. 324/117 H |
| 2009/0058435 A1 * | 3/2009 | Nakamura .................... 324/719 |
| 2009/0096092 A1 * | 4/2009 | Patel ............................. 257/737 |
| 2009/0230299 A1 * | 9/2009 | Shichi et al. .................. 250/282 |
| 2009/0268869 A1 * | 10/2009 | Hadland ......................... 378/58 |
| 2009/0315178 A1 * | 12/2009 | Sakurai et al. ................ 257/737 |
| 2010/0007018 A1 * | 1/2010 | Wyatt et al. ................... 257/737 |
| 2010/0116984 A1 * | 5/2010 | Ogawa et al. ................. 250/307 |
| 2010/0264951 A1 * | 10/2010 | Shioga et al. ................. 324/765 |
| 2010/0289500 A1 * | 11/2010 | Itoh et al. ...................... 324/537 |
| 2010/0295567 A1 * | 11/2010 | Chang .......................... 324/719 |

FOREIGN PATENT DOCUMENTS

JP            06-273346 A    *    9/1994

* cited by examiner

*Primary Examiner* — Kiley Stoner
(74) *Attorney, Agent, or Firm* — Slater & Matsil, L.L.P.

(57) ABSTRACT

A method includes electrically grounding a first plurality of metal bumps on a first surface of an interconnection component to a common ground plate. A voltage contrast (VC) image of a second plurality of metal bumps of the interconnection component is generated. Grey levels of the second plurality of metal bumps in the VC image are analyzed to find defect connections between the second plurality of metal bumps and respective ones of the first plurality of metal bumps.

20 Claims, 7 Drawing Sheets

METHODS FOR DETECTING DEFECT CONNECTIONS BETWEEN METAL BUMPS

BACKGROUND

In the art of integrated circuits, there are various interconnection components used for interconnection purposes. For example, in 2.5-dimensional (2.5D) integrated circuits, interposers are used for bonding device dies thereon. Package substrates are also used to bond either device dies or interposers thereon. The interconnection components have metal bumps formed on the surfaces, and metal connections are built inside the connection components to interconnect the metal bumps. To improve the yield in packaging processes, defect connections need to be found Some of the interconnection components, for example, interposers, may include thousands or more metal bumps, which are connected to other metal bumps on the same interposers through through-substrate vias (TSVs) and metal lines in the interposers. The sizes of the metal bumps became increasingly smaller, and may reach as small as 20 μm, for example. The probing of the metal bumps with such small size and such huge amount thus became more and more difficult. Accordingly, it is difficult to find defect metal connection through the probing of the metal bumps.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2 and 3 illustrate a top view and a perspective view, respectively, in the process of grounding a first metal bump group, and generating a voltage contrast (VC) image of a second metal bump group;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for quickly detecting defect connections in interconnection components is provided in accordance with an embodiment. The variations and the operation of the embodiment are discussed. Throughout the various views and illustrative embodiments, like reference numbers are used to designate like elements.

Figure 1:
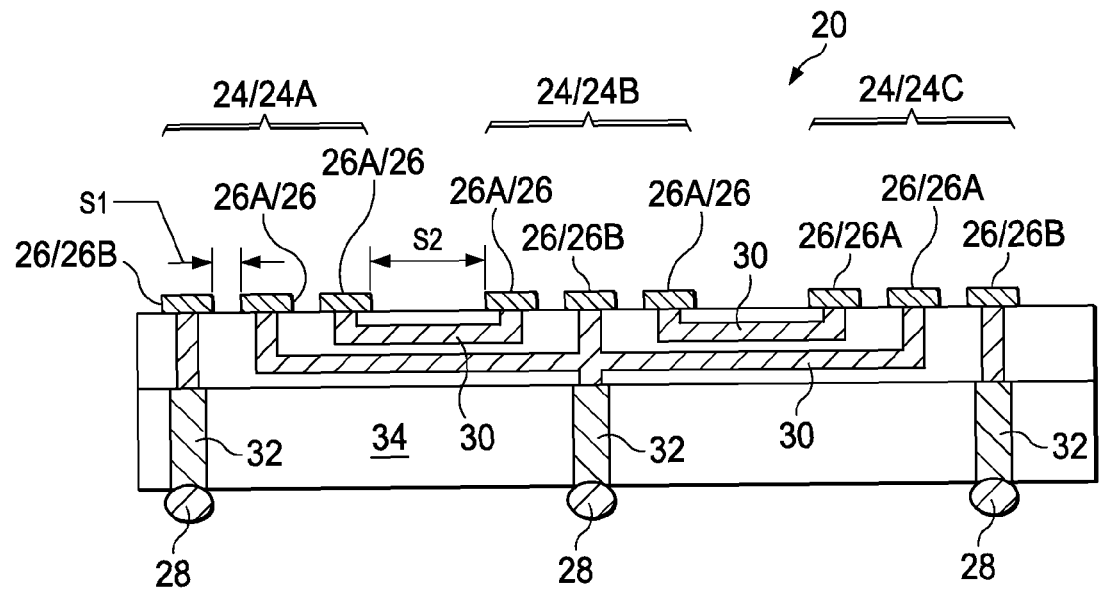
FIG. 1 illustrates a cross-sectional view of an interconnection components comprising a plurality of metal bump groups.

FIG. 1 schematically illustrates a cross-sectional view of exemplary interconnection component 20, which includes metal bumps 26 (including 26A and 26B) on a first surface, and metal bumps 28 on a second surface opposite the first surface. In an embodiment, interconnection component 20 is an interposer wafer or an interposer chip, which includes metal lines 30 interconnecting metal bumps 26A. Through-substrate vias (TSVs) 32 may be formed in substrate 34, and interconnect metal bumps 26B and 28. Substrate 34 may be a silicon substrate or a dielectric substrate. Interconnection component 20 may also be any other type of interconnection component including, but not limited to, a package substrate, a printed circuit board (PCB), a device die, or the like.

In an embodiment, metal bumps 26 are grouped as a plurality of metal bump groups 24 including 24A, 24B, and 24C, for example, wherein metal bumps 26 in the same metal bump group may be tightly located to each other with spacing S1 from each other, and may be arranged as an array or another periodic pattern. Different metal bump groups may have spacings S2 greater than spacing S1. In an embodiment, each of metal bump groups 24 may be used to bond to one integrated circuit device, such as a device die (not shown). Accordingly, interconnection component 20 may be used to bond a plurality of device dies thereon. Metal bump groups 24A, 24B, and 24C may be different from each other in allocation patterns, spacings S1, and/or counts. Metal bumps 28 may be used to bond interconnection component 20 to another circuit component such as a package substrate (not shown), a PCB (not shown), or the like.

Figure 2A:
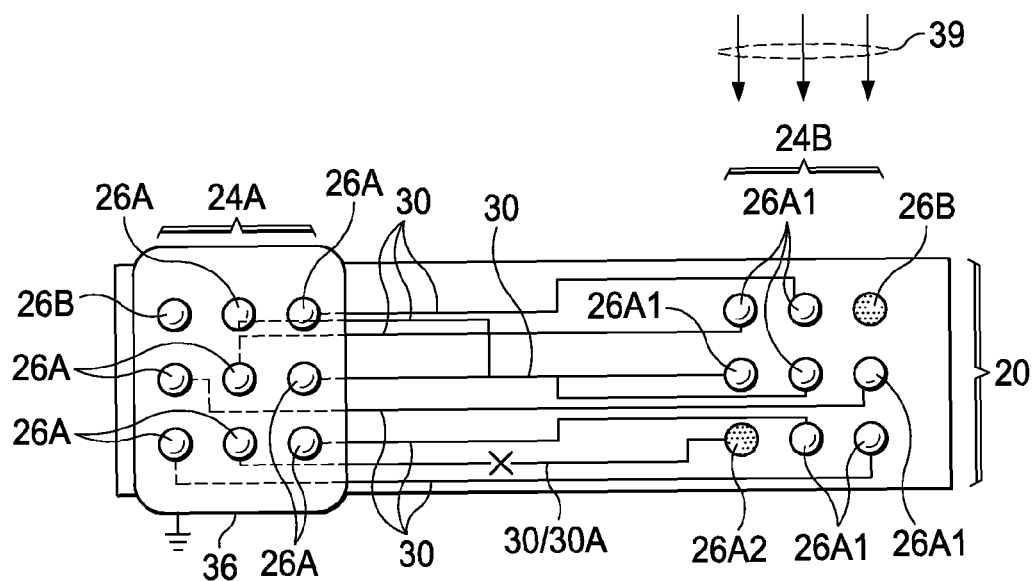
Figure 2B:
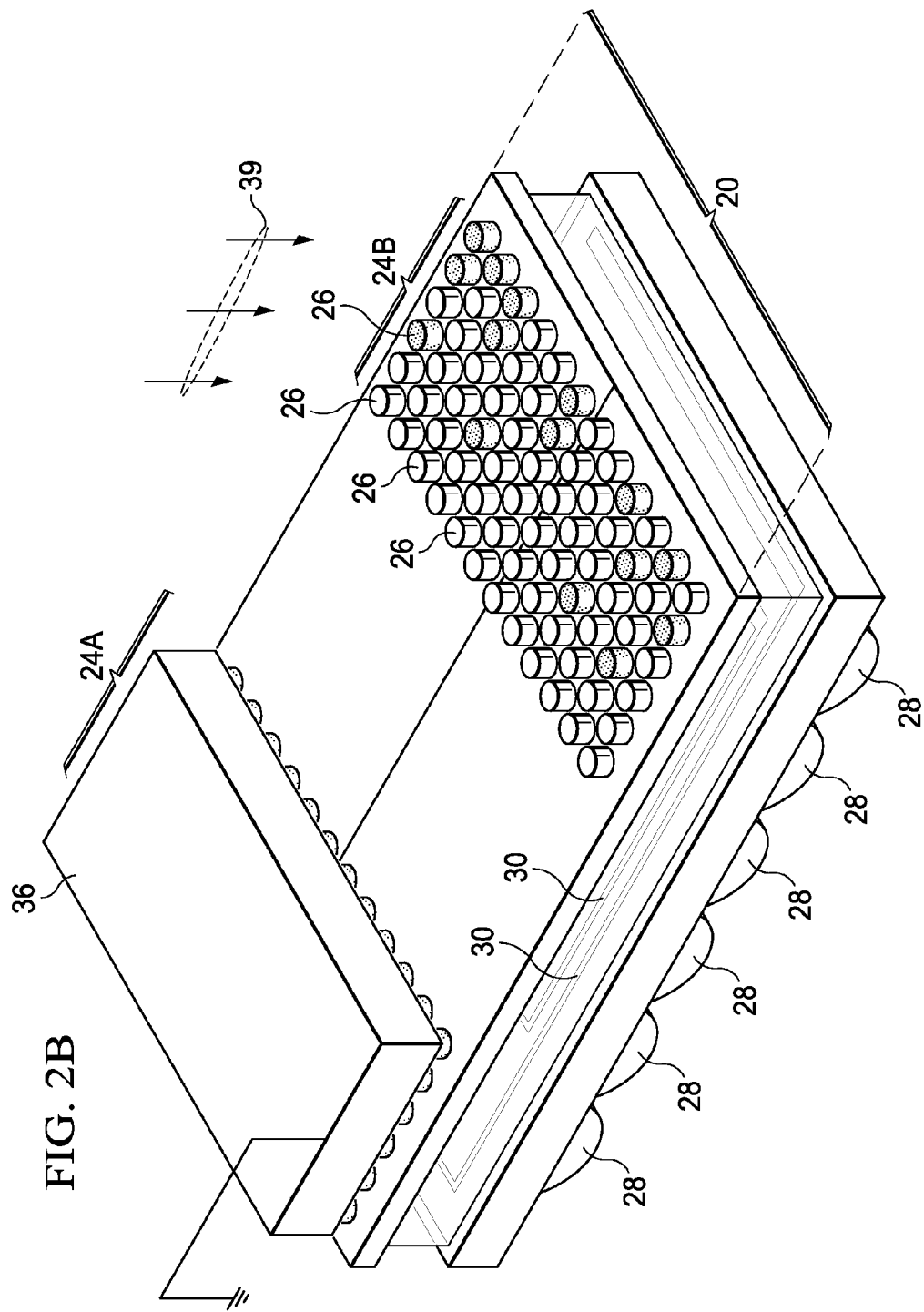

FIGS. 2A and 2B illustrate a top view and a perspective view, respectively, of a process for finding defect connections in interconnection component 20. A portion of interconnection component 20 including metal bump groups 24A and 24B are illustrated, while other metal bump groups, if any, are not shown. Metal lines 30 for interconnecting metal bumps 26A in metal bump groups 24A and 24B are also illustrated. In an embodiment, common ground plate 36 is placed over, and contacts at least some, and possibly all, metal bumps 26 in metal bump group 24A. Common ground plate 36 may have a rectangular shape. The material of common ground plate 36 includes metal or metal alloys, conductive rubber, or the like. Common ground plate 36 is electrically grounded.

Figure 3A:
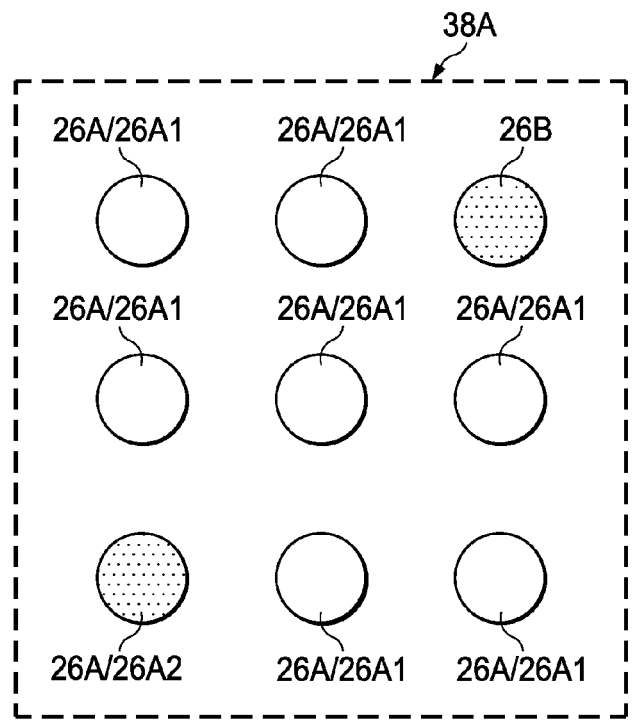
FIG. 3A schematically illustrates a VC image generated from the second metal bump group.

Voltage contrast (VC) image 38A of metal bump group 24B is then generated, as shown in FIG. 3A. VC image 38A may be generated using an electron beam inspection system such as a scanning electron microscope (SEM), an ion beam inspection system, or the like. When scanned by an ion beam or an election beam (symbolized by arrows 39 in FIG. 2A), secondary electrons are generated and emitted from the surfaces of the scanned surfaces, including the surfaces of metal bump group 24B. The data of the secondary electrons are converted to VC image 38A, which shows the brightness of the features on the scanned portion of interconnection component 20. Throughout the description, a term "gray level" is alternatively used to indicate the brightness, wherein a high gray level represents a high brightness. A grounded charged surface portion of interconnection component 20 does not charge, thus its appearance is relatively brighter, while an insulated surface portion charges, and thus appears relatively darker. Accordingly, metal bumps 26A1 in metal bump group 24B that are properly connected to metal bump group 24A are grounded through common ground plate 36, and hence are bright in VC image 38A. Metal line 30A is broken, and hence metal bump 26A2 is not electrically grounded. Accordingly, in VC image 38A, metal bump 26A2 is dark. Metal bump 26B is connected to TSV 32 (FIG. 1) and is not connected to any metal bump in metal bump group 24A. Accordingly, Metal bump 26B is also dark in VC image 38A.

Figure 3B:
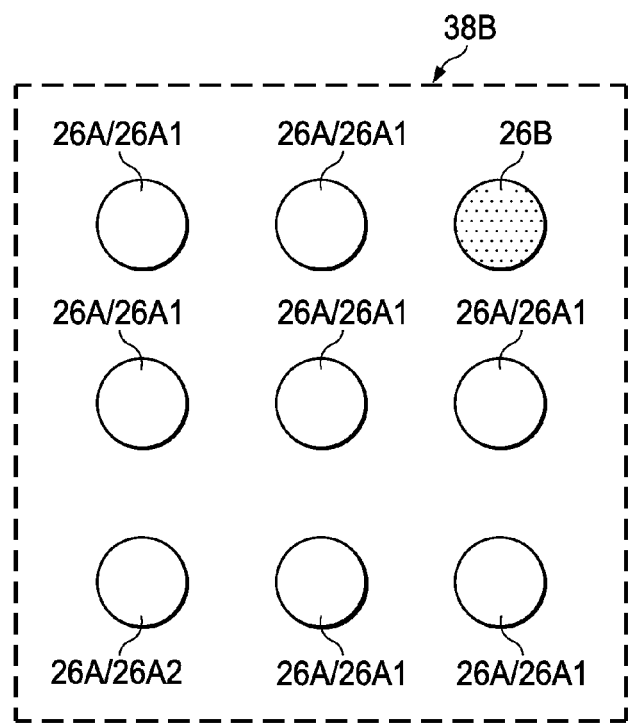
FIG. 3B illustrates a reference VC image generated from a metal bump group of a known-good interconnection component.

VC image 38A is then analyzed, and the grey level of each of metal bumps 26 in metal bump group 24B is analyzed to find out defect connections. In an embodiment, the analysis is performed by comparing VC image 38A with reference VC image 38B, as shown in FIG. 3B. Reference VC image 38B is the VC image of metal bump group 24B in which all connections to metal bumps 26 in metal bump group 24B are defect free. Reference VC image 38B may be generated by scanning metal bump group 24B of a known-good sample of interconnection component 20, with metal bump group 24A grounded when the scanning is performed. Accordingly, as shown in FIG. 3B, in reference VC image 38B, metal bump 26B is dark, while all metal bumps 26A including 26A1 and 26A2 are bright.

By comparing VC image 38A with reference VC image 38B, it is found that the grey levels of metal bumps 26A1 and 26B in the generated VC image and reference VC image 38 match with each other, while the grey levels of metal bump 26A2 in VC image 38A and reference VC image 38B do not match. The expected bright metal bump 26A2 appears to be dark in VC image 38A. It may then be determined that metal bump 26A2 in metal bump group 24B has an open connection. Conversely, if the comparison reveals that an expected dark metal bump (not shown) appears to be bright in VC image 38A, it may also be determined that the respective dark metal bump is undesirable shorted to other grounded metal features such as metal lines 30 and metal bumps 26 in metal bump group 24A.

Figure 4:
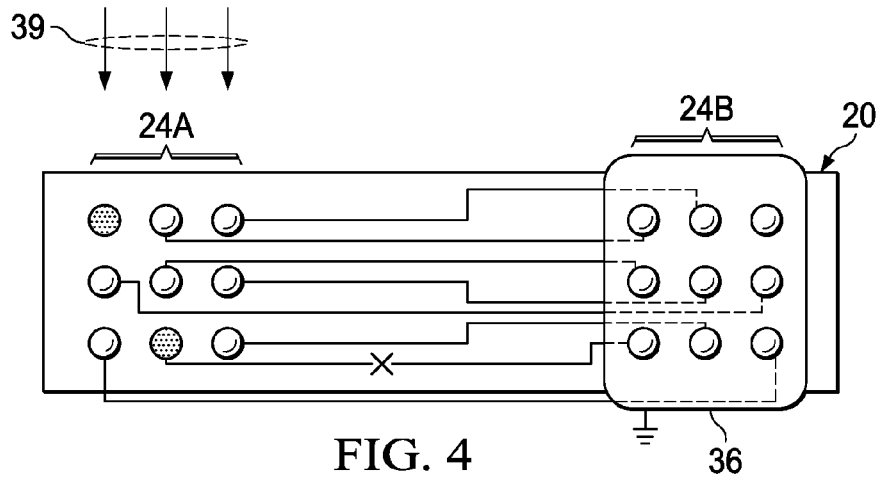
FIG. 4 illustrates a top view in the process of grounding the second metal bump group and generating a VC image of the first metal bump group.

In FIG. 4, which is a top view of the detecting process of interconnection component 20, metal bump group 24B is covered and electrically grounded through common ground plate 36, and the VC image of metal bump group 24A is generated. The generated VC image may then be analyzed using essentially the same method as shown in FIGS. 3A and 3B. It is noted that if interconnection component 20 includes only two metal bump groups 24 on a same side, the process shown in FIG. 4 may not need to be performed. However, if interconnection component 20 includes more than two metal bump groups 24, each of the metal bump groups 24 may be electrically grounded, and the VC images of the remaining un-grounded metal bump groups 24 are generated and analyzed to find defect connections of metal bumps 26 between each pair of metal bump groups 24.

Figure 5:
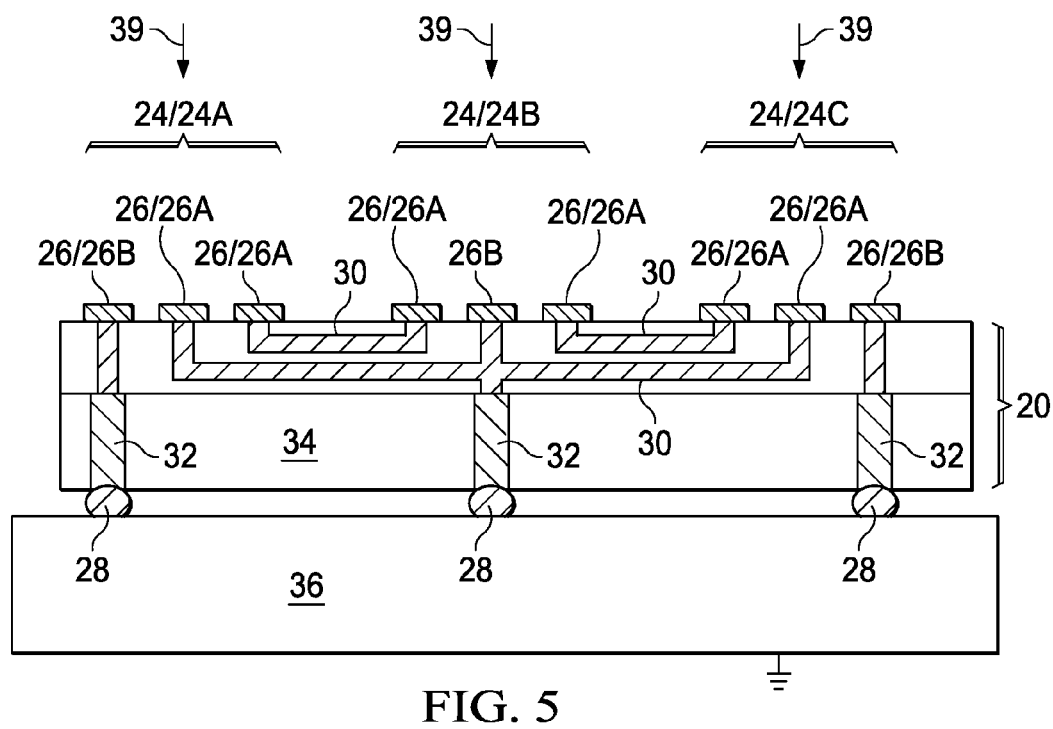
FIG. 5 illustrates a cross-sectional view in the process of grounding the metal bump on a side of an interconnection component, and generating a VC image of the metal bump groups on an opposite side of the interconnection component.

FIG. 5 illustrates the detection of defect connections between metal bumps on opposite sides of interconnection component 20, which detection step is also referred to as a dual-side detection. Common ground plate 36 contacts metal bumps 28. In an embodiment, common ground plate 36 has a size at least close to, or even greater than, the size of interconnection component 20, so that all metal bumps 28 are interconnected through common ground plate 36, and are electrically grounded. In alternative embodiments, a portion, but not all, of metal bumps 28 are electrically grounded through common ground plate 36.

A VC image may then be generated for metal bumps 26. The VC image is similar to what is shown in FIG. 3A, except it may include the images of all metal bump groups 24 in interconnection component 20. Accordingly, the VC image is not illustrated. In the embodiments wherein all metal bumps 28 are grounded through common ground plate 36, all metal bumps 26 are scanned to generate the VC image. Metal bumps 26B that are appropriately connected to metal bumps 28 appear to be bright. Conversely, metal bumps 26A, which do not have connections to metal bumps 28, appear to be dark. Furthermore, metal bumps 26B that are intended to have connections to metal bumps 28 may also be dark in the VC image if open circuits occur, and the connection to metal bumps 28 are broken. Similarly, metal bumps 26A that are intended not to have connections to metal bumps 28 may also be bright in the respective VC image if circuit shorting occurs, and some of metal bumps 26A are undesirably shorted to metal bumps 28. Accordingly, through the analysis of the VC image, defect connections between metal bumps 26 and metal bumps 28 on opposite sides of interconnection component 20, such as undesirable open connections and undesirable short connections, may be found. In an embodiment, the analysis of the VC image may be performed by comparing the VC image to a reference VC image generated from a known-good sample interconnection component 20 with no defect connections.

Figure 6:
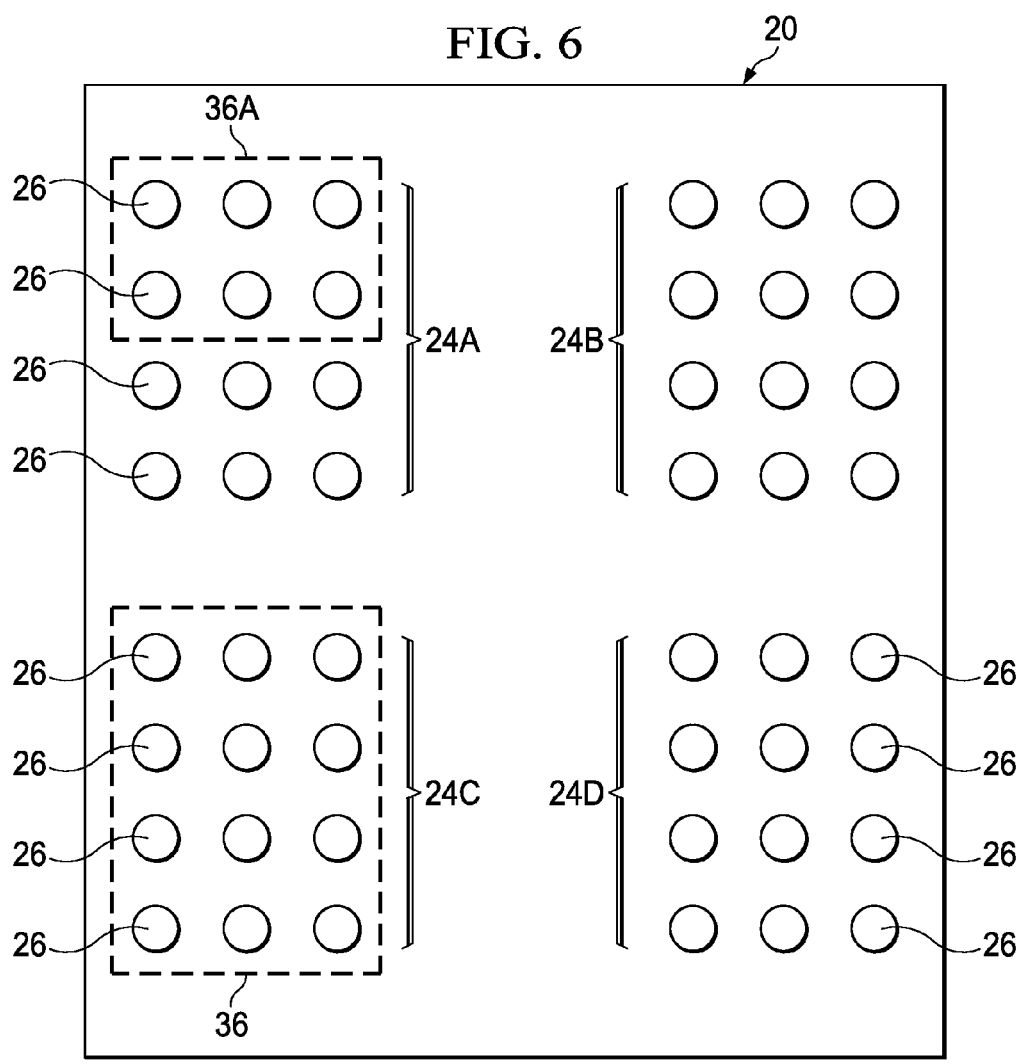
FIG. 6 illustrates a top view of an interconnection component comprising a plurality of metal bump groups on a same side.

FIG. 6 illustrates a top view of interconnection component 20, wherein a plurality of metal bump groups 24 including 24A through 24D are shown. Interconnection component 20 may also include fewer or more metal bump groups. In an embodiment, as shown in FIGS. 2 through 3B, in each of the VC image generation and analysis process, an entirety of a metal bump group selected from metal bump groups 24A through 24D is grounded through a common ground plate (such as the common ground plate 36 connected to metal bump group 24B), while the VC images of the remaining ones of the metal bump groups 24 are scanned and analyzed. In alternative embodiments, in each of the VC image generation and analysis process, two or more of metal bump groups 24 are grounded through a common ground plate, while the VC images of the remaining ones of the metal bump groups 24 are generated and analyzed. In yet other embodiments, in each of the VC image generation and analysis process, a portion, but not all, of one (or more) of metal bump groups 24 is grounded through a common ground plate, while the VC images of un-grounded portions of the metal bump groups 24 are generated and analyzed. For example, FIG. 6 illustrates that metal bumps 26 may be electrically grounded by common ground plate 36A, wherein common ground plate 36A may have a size smaller than the size of metal bump group 24A.

The detection of defect connections may be performed at chip level or wafer level. For a chip-level detection, the illustrated interconnection component 20 as shown in FIGS. 1 through 2B is a chip, which is a portion of a wafer (such as wafer 100 in FIG. 8). The detection may be performed before or after the chip is sawed from the respective wafer. With the chip-level detection, in an VC image generation and analysis process, a portion of metal bumps in the chip are grounded, while metal bumps in other chips are not grounded. Accordingly, only the defect connections of a single chip are detected each time.

Figure 7:
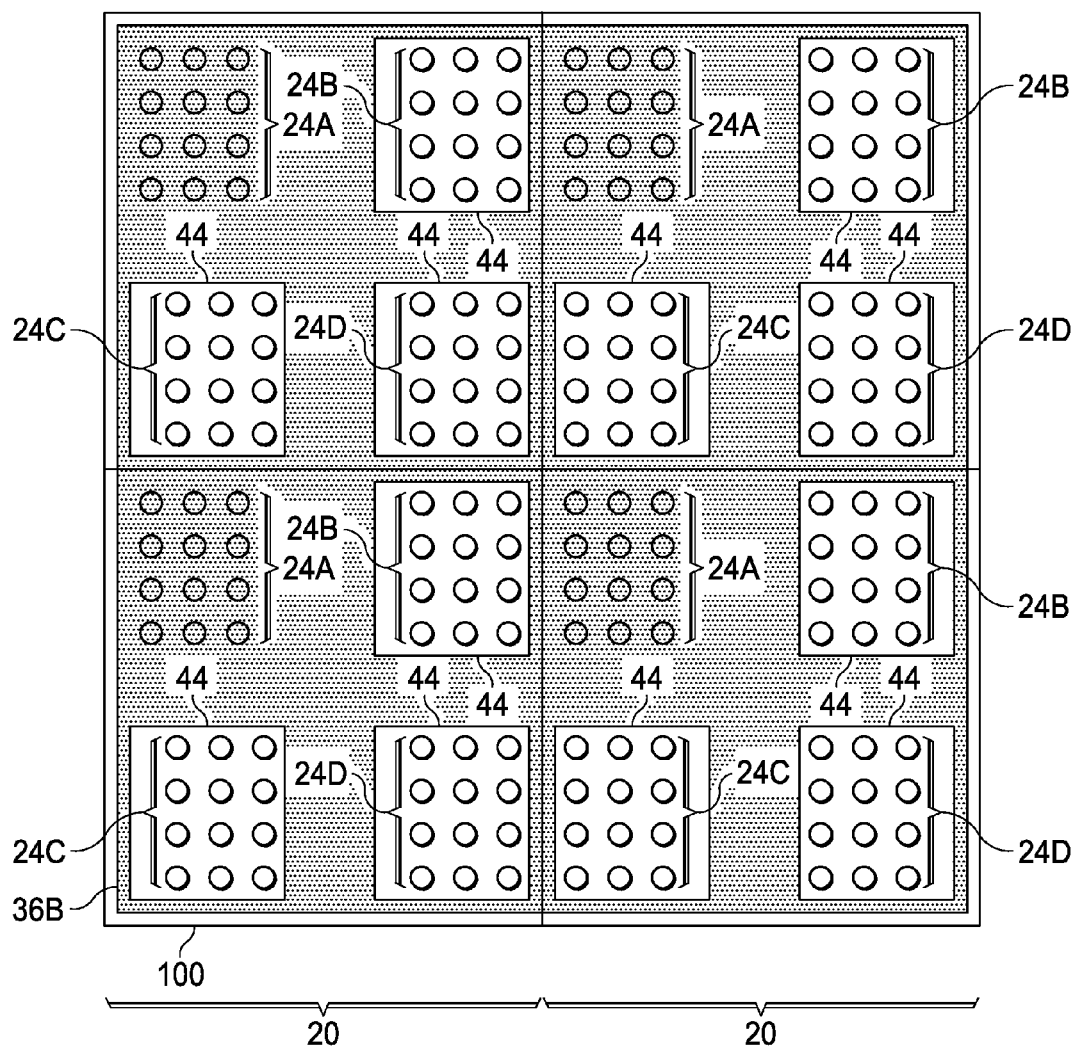
FIG. 7 illustrates a top view in the process of grounding metal bump groups on a wafer including a plurality of chips, and generating a VC image of the metal bump groups that are not grounded.
Figure 8:
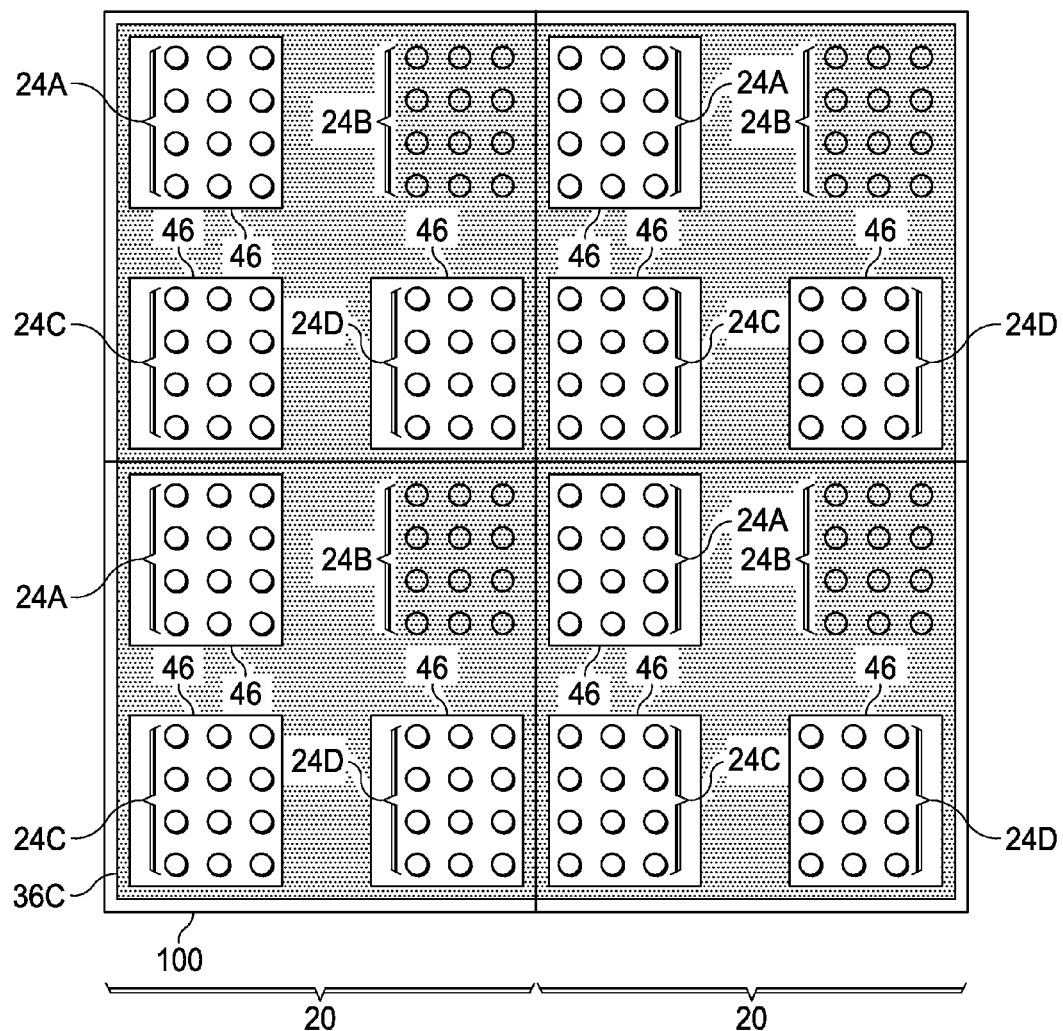
FIG. 8 illustrates a top view in the process of grounding metal bump groups on the wafer shown in FIG. 7, and generating a VC image of the metal bump groups that are not grounded, wherein the common ground plate used in FIGS. 7 and 8 have different patterns.

Conversely, a wafer-level detection may be performed. FIGS. 7 and 8 illustrate top views of wafer 100 when the wafer-level detection is performed using different common ground plates. In FIG. 7, wafer 100 is provided, wherein a plurality of chips (interconnection components) 20 identical to each other are located in wafer 100. Common ground pate 36B has a size close to the size of wafer 100, and includes a plurality of openings 44, through which metal bump groups 24B, 24C, and/or 24D are exposed. All metal bump groups 24A are electrically grounded by common ground pate 36B. The VC image of wafer 100 may then be generated and analyzed, so that for all connections from metal bump groups 24B, 24C, and/or 24D to the respective metal bump groups 24A may be detected.

FIG. 8 illustrates the detection using common ground pate 36C to detect defect connections in wafer 100, which may be the same wafer 100 as in FIG. 7. Common ground plate 36C has a pattern different from the pattern of common ground plate 36B, and also has a size close to the size of wafer 100. Common ground pate 36B is first removed. For example, common ground pate 36C includes a plurality of openings 46, through which metal bump groups 24A, 24C, and/or 24D are exposed, while all metal bump groups 24B are electrically grounded by common ground pate 36C. The VC image of wafer 100 may then be generated and analyzed, so that for all connections from metal bump groups 24A, 24C, and/or 24D to the respective metal bump groups 24B may be detected.

Similarly, the detection of the connections between metal bumps 26 and 28 may be performed at either chip level or at wafer level. The detection details are essentially the same as shown in FIG. 5, except that commonly ground plate 36 may either be chip size or wafer size, and hence either metal bumps 28 in a chip only are electrically grounded or metal bumps 28 in the entire wafer are electrically grounded. Accordingly, the VC image may include either the image of metal bumps 26 of a single chip, or alternatively, the image of metal bumps 26 of an entire wafer. The interconnections between metal bumps 26 and 28 on one chip or an entire wafer may hence be detected through a single VC image and a single reference VC image.

The embodiments may also be used to detect soft-open connection, which are not fully open connections, but have resistances greater than normal metal connections. For example, referring to FIG. 2A, if metal line 30A1 connected to metal bump 26A2 has a high resistance instead of being broken, the grey level of metal bump 26A2 in VC image 38A (FIG. 3A) will be between the grey level of metal bumps 26A1 and the grey level of metal bump 26B. The soft-open connection may thus be detected without additional process steps.

In the embodiments, the interconnections of a plurality of metal bumps may be detected through a same process. Furthermore, the analysis may also be performed through a computer or manually. The throughput of the defect detection may thus be significantly improved. The defect detection is not limited by the small pitch size of metal bumps, and may be used on future generations of integrated circuits.

In accordance with embodiments, a method includes electrically grounding a first plurality of metal bumps on a first surface of an interconnection component to a common ground plate. A VC image of a second plurality of metal bumps of the interconnection component is generated. Grey levels of the second plurality of metal bumps in the VC image are analyzed to find defect connections between the second plurality of metal bumps and respective ones of the first plurality of metal bumps.

In accordance with other embodiments, a method includes providing an interconnection component including a first and a second plurality of metal bumps on a first side of the interconnection component; first connections in the interconnection component and connecting portions of the first plurality of metal bumps to portions of the second plurality of metal bumps; a third plurality of metal bumps on a second side of the interconnection component, wherein the first and the second sides are opposite sides; and second connections in the interconnection component and connecting portions of the first and the second plurality of metal bumps to portions of the third plurality of metal bumps. The first or the third plurality of metal bumps is electrically connected to a common ground plate, wherein the common ground plate is electrically grounded. A VC image of the second plurality of metal bumps is generated. A reference VC image of a fourth plurality of metal bumps is generated. The fourth plurality of metal bumps is in a known-good reference interconnection component having an identical design as the interconnection component. The fourth plurality of metal bumps corresponds to the second plurality of metal bumps. Grey levels of the second plurality of metal bumps in the VC image are compared to grey levels of respective ones of the fourth plurality of metal bumps in the reference VC image to find defect connections among the first and the second connections.

In accordance with yet other embodiments, a method includes providing a wafer comprising a plurality of chips, wherein each of the plurality of chips comprises a first plurality of metal bumps on a first surface of the wafer, and a second plurality of metal bumps on a second surface of the wafer opposite the first surface. The second plurality of metal bumps of the plurality of chips is electrically grounded through a common ground plate. A VC image of the first plurality of metal bumps in the plurality of chips is generated. Grey levels of the first plurality of metal bumps in the VC image are analyzed to find defect connections between the first plurality of metal bumps and the second plurality of metal bumps.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   connecting a first plurality of metal bumps on a first surface of an interconnection component to a common ground plate, wherein the common ground plate is electrically grounded;
   generating a voltage contrast (VC) image of a second plurality of metal bumps of the interconnection component; and
   analyzing grey levels of the second plurality of metal bumps in the VC image to find defect connections between the second plurality of metal bumps and respective ones of the first plurality of metal bumps.

2. The method of claim 1, wherein the first and the second plurality of metal bumps are configured to bond a first and a second integrated circuit device, respectively, to the interconnection component.

3. The method of claim 2, wherein metal bumps inside the first plurality of metal bumps have a first spacing, wherein the first plurality of metal bumps have a second spacing from the second plurality of metal bumps, and wherein the second spacing is greater than the first spacing.

4. The method of claim 1, wherein the second plurality of metal bumps is on the first surface of the interconnection component.

5. The method of claim 1, wherein the second plurality of metal bumps is on a second surface of the interconnection component, and wherein the first and the second surfaces are opposite surfaces of the interconnection component.

6. The method of claim 1, wherein the step of generating the VC image comprises a step selected from the group consisting essentially of scanning using an electron beam and scanning using an ion beam.

7. The method of claim 1, wherein the step of analyzing grey levels of the second plurality of metal bumps comprises comparing the grey levels of the second plurality of metal bumps with grey levels of respectively ones of a third plurality of metal bumps in a reference VC image.

8. The method of claim 7 further comprising scanning a known-good sample not having any defect connections to generate the reference VC image, wherein the known-good sample and the interconnection component have an identical design.

9. A method comprising:
providing an interconnection component comprising:
a first and a second plurality of metal bumps on a first side of the interconnection component;
first connections in the interconnection component and connecting portions of the first plurality of metal bumps to portions of the second plurality of metal bumps;
a third plurality of metal bumps on a second side of the interconnection component, wherein the first and the second sides are opposite sides; and
second connections in the interconnection component and connecting portions of the first and the second plurality of metal bumps to portions of the third plurality of metal bumps;
connecting the first or the third plurality of metal bumps to a common ground plate, wherein the common ground plate is electrically grounded;
generating a voltage contrast (VC) image of the second plurality of metal bumps;
generating a reference VC image of a fourth plurality of metal bumps in a known-good reference interconnection component having an identical design as the interconnection component, wherein the fourth plurality of metal bumps correspond to the second plurality of metal bumps; and
comparing grey levels of the second plurality of metal bumps in the VC image to grey levels of respective ones of the fourth plurality of metal bumps in the reference VC image to find defect connections among the first and the second connections.

10. The method of claim 9, wherein the step of connecting the first or the third plurality of metal bumps comprises connecting the first plurality of metal bumps to the common ground plate, wherein in the step of comparing, defect connections among the first connections are determined.

11. The method of claim 9, wherein the step of connecting the first or the third plurality of metal bumps comprises connecting the third plurality of metal bumps to the common ground plate, wherein the VC image comprises images of both the first and the second plurality of metal bumps, and wherein in the step of comparing, defect connections among the second connections are determined.

12. The method of claim 9, wherein the common ground plate has a wafer size, and wherein the VC image comprises images of metal bumps of a plurality of identical chips in a wafer.

13. The method of claim 9, wherein the common ground plate has a chip size, and wherein the VC image comprises images of metal bumps of a single chip, and does not comprise images of metal bumps from other chips.

14. The method of claim 9, wherein the interconnection component comprises an interposer comprising through-substrate vias therein.

15. A method comprising:
providing a wafer comprising a plurality of chips, wherein each of the plurality of chips comprises:
a first plurality of metal bumps on a first surface of the wafer; and
a second plurality of metal bumps on a second surface of the wafer opposite the first surface;
electrically grounding the second plurality of metal bumps of the plurality of chips through a first common ground plate;
generating a first voltage contrast (VC) image of the first plurality of metal bumps in the plurality of chips; and
analyzing grey levels of the first plurality of metal bumps in the first VC image to find defect connections between the first plurality of metal bumps and the second plurality of metal bumps.

16. The method of claim 15, wherein each of the plurality of chips further comprises a third plurality of metal bumps on the first surface of the wafer, and wherein the method further comprises:
electrically grounding the first plurality of metal bumps of the plurality of chips through a second common ground plate, wherein the second common ground plate comprises a plurality of openings, and wherein the third plurality of metal bumps of the plurality of chips is exposed through the openings;
generating a second VC image of the third plurality of metal bumps of the plurality of chips; and
analyzing grey levels of the third plurality of metal bumps in the second VC image to find defect connections between the first and the third plurality of metal bumps.

17. The method of claim 16 further comprising:
disconnecting the first plurality of metal bumps of the plurality of chips from the second common ground plate;
electrically grounding the third plurality of metal bumps of the plurality of chips through a third common ground plate having a different pattern than the second common ground plate, wherein the third common ground plate comprises a plurality of openings, and wherein the first plurality of metal bumps of the plurality of chips is exposed through the openings;
generating a third VC image of the first plurality of metal bumps of the plurality of chips; and
analyzing grey levels of the first plurality of metal bumps in the third VC image to find defect connections between the first and the third plurality of metal bumps.

18. The method of claim 16, wherein the first plurality of metal bumps in one of the plurality of chips is configured to bond a first device die thereon, and the third plurality of metal bumps in the one of the plurality of chips is configured to bond a second device die thereon.

19. The method of claim 15, wherein the wafer is an interposer wafer comprising through-substrate vias therein.

20. The method of claim 15, wherein the defect connections comprise open connections and short circuits.

* * * * *